(12) United States Patent
Hwang

(10) Patent No.: US 6,347,442 B1
(45) Date of Patent: Feb. 19, 2002

(54) PRINTED CIRCUIT BOARD FLAT LEVEL COMPENSATING UNIT OF SURFACE MOUNTING APPARATUS

(75) Inventor: Eui Sung Hwang, Seoul (KR)

(73) Assignee: Mirae Corporation, Chunan-shi (KR)

( * ) Notice: Subject to any disclaimer, the term of this patent is extended or adjusted under 35 U.S.C. 154(b) by 0 days.

(21) Appl. No.: 09/567,011

(22) Filed: May 9, 2000

(30) Foreign Application Priority Data

May 10, 1999 (KR) ............................................. 99-16612

(51) Int. Cl.[7] ................................................. B23Q 1/00
(52) U.S. Cl. .......................... 29/281.4; 269/21; 269/73; 269/71; 269/903
(58) Field of Search ............................... 269/20, 21, 8, 269/60, 73, 903, 71, 281.4; 29/559, 759

(56) References Cited

U.S. PATENT DOCUMENTS

| | | | | |
|---|---|---|---|---|
| 5,171,002 A | * | 12/1992 | Herke et al. | 269/73 |
| 5,544,872 A | * | 8/1996 | Schuit | 269/60 |
| 5,915,678 A | * | 6/1999 | Slocum et al. | 269/903 |
| 6,109,840 A | * | 8/2000 | Raiteri | 269/73 |
| 6,189,876 B1 | * | 2/2001 | Frazier | 269/21 |

* cited by examiner

Primary Examiner—Robert C. Watson
(74) Attorney, Agent, or Firm—Fleshner & Kim, LLP

(57) ABSTRACT

The present invention relates to a printed circuit board(PCB) flat level compensating unit of a surface mounting apparatus in which when a PCB is stopped at its working position and is firstly pushed up from the lower portion thereof, the PCB is secondly pushed to be raised thereby to be compensated its flat level and the mounting height for the PCB according the thickness is adjusted thereby to be increased a mounting efficient and a precision. The present invention provides a PCB flat level compensating unit of a surface mounting apparatus including: a base; first moving unit disposed at the center portion of the base for moving in left and right direction; transfer unit installed at a bracket secured to the first moving unit; driving unit installed at the transfer unit; adjusting unit installed at the lower portion of the base and connected to the first moving unit; second moving unit for moving the adjusting unit; and at least one compensating unit installed at the base for pushing and sucking the PCB to compensate its distortion.

20 Claims, 8 Drawing Sheets

PRINTED CIRCUIT BOARD FLAT LEVEL COMPENSATING UNIT OF SURFACE MOUNTING APPARATUS

BACKGROUND OF THE INVENTION

1. Field of the Invention

The present invention relates to a printed circuit board (PCB) flat level compensating unit of a surface mounting apparatus in which when a PCB is stopped at its working position and is firstly pushed up from the lower portion thereof, the PCB is secondly pushed to be raised thereby to be compensated its flat level and the mounting height for the PCB according the thickness is adjusted thereby to be increased an amounting efficient and a precision 2. Description of the Prior Art It has been developed rapidly an electric and electronic products for directing high density, small size and variety. Especially, it has been accelerated a surface mounting technology using a surface mounting apparatus for manufacturing a Printed Circuit Board(PCB).

The surface mounting apparatus is very important constituting the surface mounting assembly apparatus for mounting a surface mounting device to the PCB and is supplied with the surface mounting device from a device supplier thereby to feed to a mounting position on the PCB and mounts it on the PCB.

The surface mounting apparatus can be divided into a high-speed apparatus and a general-use apparatus by function. The high-speed apparatus can accomplish the high-speed mounting operation because it is constructed to assembly many devices in a short time. Therefore, it has a merit that it comply with a mass production, however, its mounting precision become deteriorated.

Meanwhile, the general-use apparatus can accomplish a high-precision because it is constructed to comply with many devices. Therefore, it has a merit that it comply with a medium, small production, however, a productivity become deteriorated because of a low-speed mounting operation.

The surface mounting apparatus comprises a feeder (referring to "a tape feeder" as below) for supplying a device to be mounted, a X-Y gantry for determining a working position, a conveyor for carrying a PCB to be worked, and a head for picking up, in regular sequence, the device from the feeder for mounting the device on the PCB.

In general, the surface mounting apparatus serves to mount an electronic device on the PCB and can be called a mounter.

More detailed structure for the mounter is as follows.

The mounter comprises; a base assembly; a conveyor installed at the upper portion of the base assembly for feeding a printed circuit board; a feeder for supplying a device or a chip so that the PCB is supplied with the device to be mounted; a monitor head assembly for mounting each device being supplied from the feeder; a vision part for acknowledging and correcting the position of the device; and a X-Y gantry installed with the vision part and the mounter head for determining the position by the table.

The head part comprises a suction nozzle for directly sucking the device, a nozzle chuck for fixing the sucked device, and a nozzle exchanging unit for exchanging the nozzle.

The conveyor is for feeding the PCB to be mounted various chips. When the PCB is fed by the conveyor belt installed at the conveyor the stopping unit is contacted with one side of the PCB to be stopped at the working position so that the mounter head can mount the chip.

When the PCB is stopped its movement, the PCB is ascended by the compensating unit to be contacted with the rail., Therefore, the chip is correctly mounted.

The PCB has a self-distortion to be burgled in the upper direction or to be dented in the lower direction according to 0.4 mm to 4.0 mm of thickness thereof when the PCB is supplied to the conveyor.

This phenomenon is occurred at the initial stage of PCB manufacturing process. Therefore, it cannot be constantly kept a flat level for the PCB.

To compensating the distortion of the PCB like that, it is used the method that the PCB is pushed from the lower portion thereof by the pin or is sucked to be compensated its flat level thereby to be constantly kept its thickness.

However, the conventional PCB should be necessary with the independent compensating unit for compensating the flat level because it is raised to the mounting height without being controlled when the PCB is ascended for mounting the device thereon after the PCB is stopped at its working position.

Although some apparatuses use the method that the PCB is pushed from the lower portion thereof by the pin because it is difficult to control its position, the device can not be easily mounted on the PCB.

That is, when the PCB is excessively pushed in the upper direction it is difficult to mount the device on the PCB. Furthermore, various electronic devices or differential kinds of devices can not be continuously mounted on the PCB by the same apparatus.

Further, because the height of the device to be mounted is different each other the error for position can not be prevented thereby causing the device to be broken or be deformed. Therefore, a reliability for a produced good became deteriorated.

SUMMARY OF THE INVENTION

Therefore, the present invention has been invented to solve the above problems, it is an object to provided a printed circuit board flat level compensating apparatus of a surface mounting apparatus in which when a PCB is stopped at its working position and is firstly pushed up from the lower portion thereof, the PCB is secondly pushed to be raised thereby to be compensated its flat level and the mounting height for the PCB according the thickness is adjusted thereby to be increased an amounting efficient and a precision.

To accomplish the above object the present invention provides a PCB flat level compensating unit of a surface mounting apparatus comprising: a base; first moving means disposed at the center portion of the base for moving in left and right direction; transfer means installed at a bracket secured to the first moving means; driving means installed at the transfer means; adjusting means installed at the lower portion of the base and connected to the first moving means; second moving means for moving the adjusting means; and at least one compensating means installed at the base for pushing and sucking the PCB to compensate the distortion of the PCB.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERED EMBODIMENT

Figure 1:
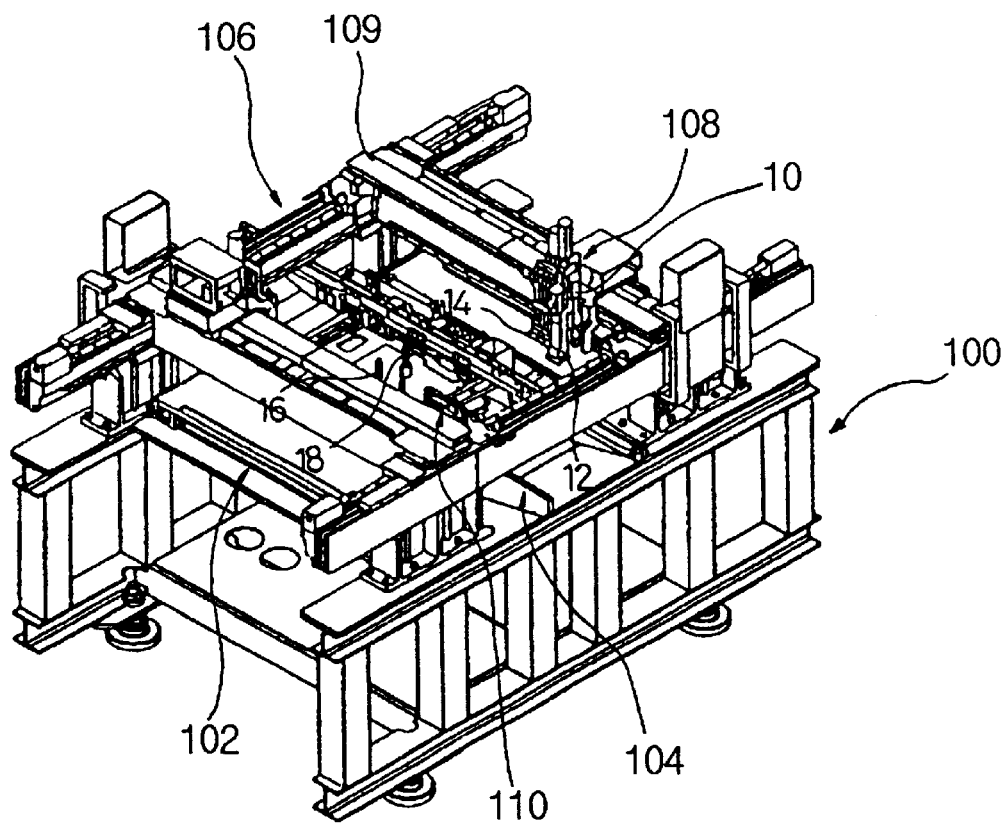
FIG. 1 is a perspective view showing a structure of a surface mounting apparatus.

A surface mounting apparatus applied to the present invention is, as shown in FIG. 1, installed with a frame assay 100.

The frame assembly 100 is, at the upper portion thereof, installed with a base assembly 102, which is installed at its upper portion with a conveyor system 104, for feeding a printed circuit board (PCB).

The conveyor system 104 is, at the upper portion thereof, installed with a X-Y 106 for moving in forward, backward, left and right directions to mount a device on the PCB fed by the conveyor system 104.

The X-Y gantry comprises each gantry frame 109 for supporting the X-axis and the Y-axis.

The gantry frame 109 is movably installed with a mounter head assembly 108 for mounting the device on the PCB being fed by the conveyor system 104.

The mounter head assembly 108 is installed with a plurality of mounter heads 10 which is installed with each nozzle 12 for sucking the device.

Furthermore, a vision unit 14 is installed for checking whether the device sucked by the nozzle 12 is correctly mounted on the PCB.

The conveyor system 104 is installed with a stopper assay 110 for stopping the PCB at the working position and is installed with a pusher 16 for ascending the PCB and is, at the lower portion thereof, installed with a magnetic piece 18 for fixing the pusher 16.

Figure 2:
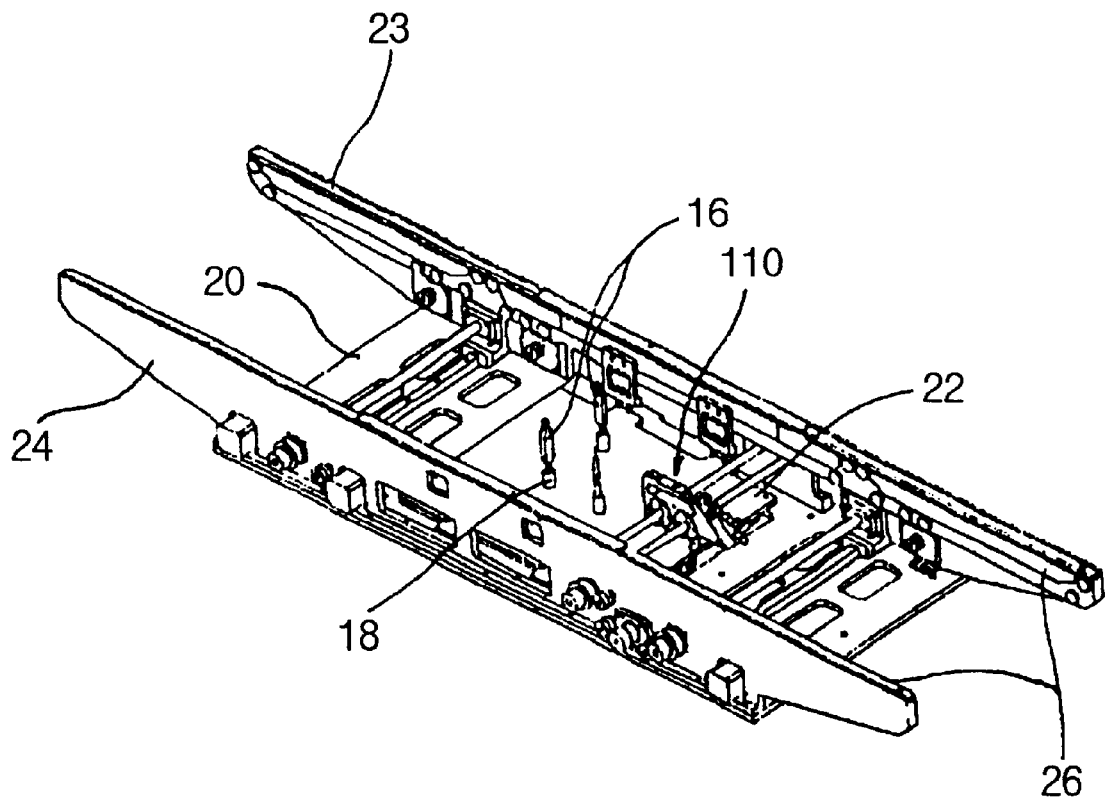
FIG. 2 is a perspective view showing a conveyor for feeding a printed circuit board.

The conveyor system is, as shown in FIG. 2, installed with guides 23 and 24 corresponding to the both sides of the base 20. The guides 23 and 24 is, at the upper portion thereof, formed with a rail 26 for slidingly moving the PCB. Between the guides 23 and 24 a push plate 22 is installed. The push plate 22 is, at the upper portion thereof, installed with a stopper assembly 110 and is at the entire portion thereof, installed with a plurality of pushers 16 for moving the stopped PCB up by the stopper assembly and is, at the lower end thereof, installed with a magnetic piece 19 for fixing the pusher 16 to the push plate 22.

Figure 3:
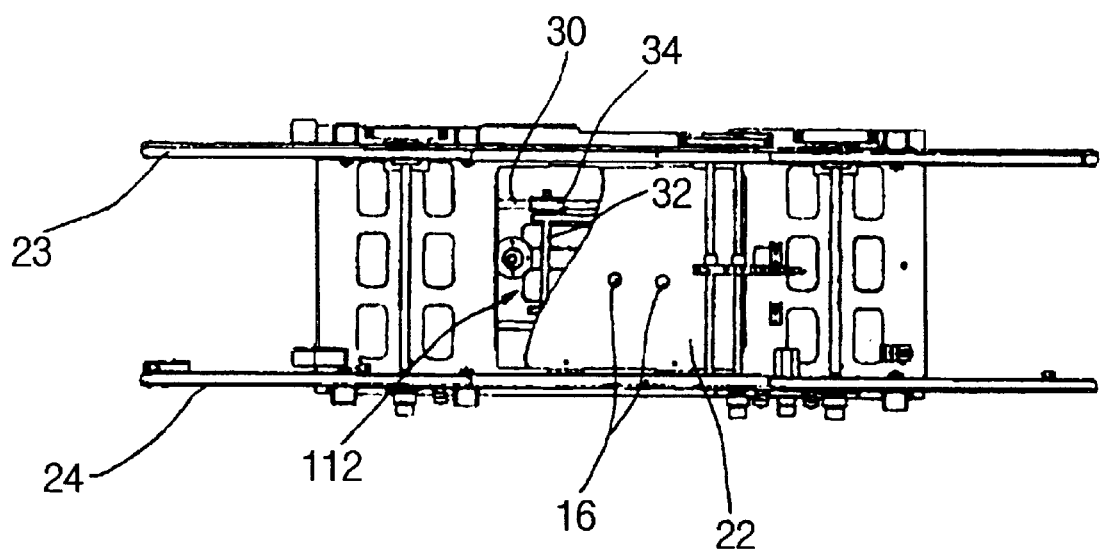
FIG. 3 is a plan view of FIG. 2.

FIG. 3 is a plan sectional view showing the center portion of FIG. 2 and shows a pushing unit 112 for the PCB installed at the lower portion of the push plate 22.

The push plate 22 is, at the lower portion thereof, installed with a shaft 32 that provided with a roller 34 at both sides thereof for moving in left and right direction.

The roller 34 is placed on the push plate guide not shown installed at the guide groove 30.

Figure 4:
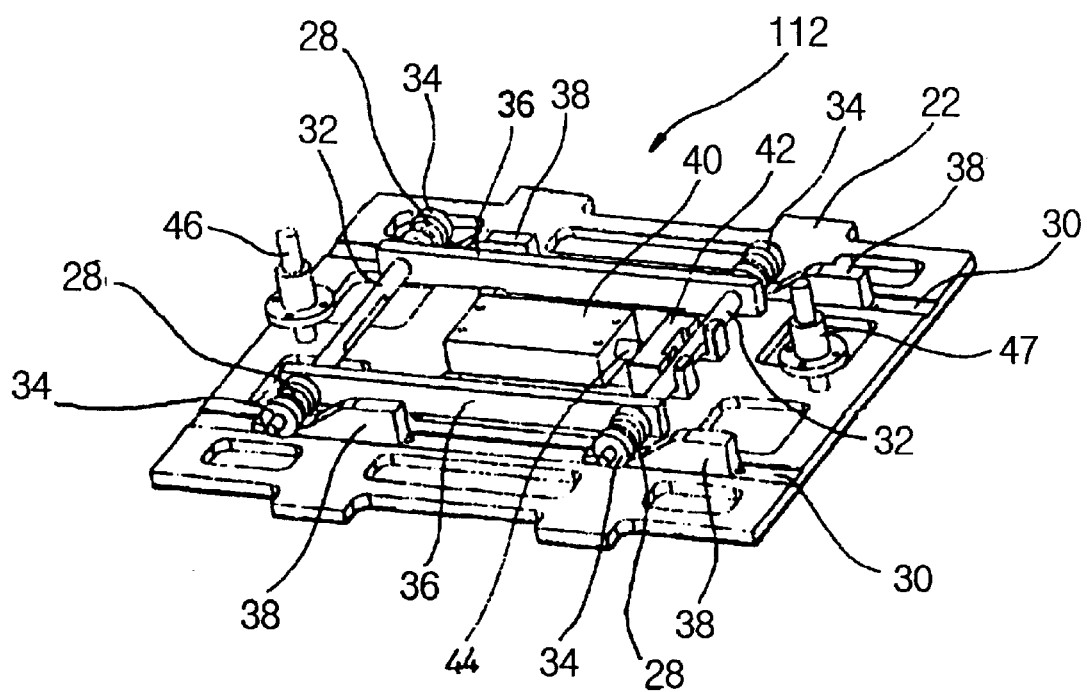
FIG. 4 is a bottom perspective view showing a compensating unit for raising the PCB.

FIG. 4 is a bottom perspective view showing the PCB pushing unit 112 according to the present invention.

The push plate 22 is, at both upper portions thereof, installed with a pair of guide grooves to be parallel. The guide grooves 30 is secured with a push plate guide 38 to be a predetermined distance each other.

The push plate guide 38 is, at the inner side thereof, installed with a square-shaped first stopper 36 to be parallel.

The first stopper 36 is, at the forward and backward portions thereof, connected with a shaft 32 provided at its both sides with a roller 34.

Between the first stopper 36 a linear servo motor 40 provided with a rod 44 is secured. The rod 44 is, at the front portion thereof, secured with one side of the second stopper 42 and other side of the second stopper 42 is secured with the shaft 32.

The roller 34 installed at both sides of the shaft 32 is formed with a roller groove 28 to be smaller the intermediate diameter than that of both sides. The roller groove 28 is formed to move along the push plate guide 38.

The push plate guide 38 is formed to be higher the right end than the left end and is formed with a grain portion to be up toward the right side.

The push plate 22 is; at the both sides thereof, installed with a guide shaft 47 to be straightly moved when the push plate 22 is ascended.

An operation of the compensating unit having the above construction will now be described when the linear servo motor 40 drives the rod 44 to move forward without stopping the second stopper 42 and the shaft 32 are also advanced.

At this time, the roller 34 is ascended along the grant portion of the push plate guide 38 and the shaft 32 are simultaneously advanced thereby to be ascended the push plate 22.

The ascending push plate 22 is advanced perpendicularly without distortion or deviation by the guide shaft 46 so that it pushes the PCB up thereby to be pushed its both sides by the rail 26 formed at the guides 23 and 24 of the conveyor system 104.

Accordingly, the PCB is fixed at its working position.

After the PCB is fixed at working position, the mounter head 10 moves in the left and right direction along the X-axis frame of the gantry 106 thereby to be mounted the device.

However, in case this it can not be compensated the various distortions of the PCB according to its thickness.

The push plate 22 is, as shown FIG. 4, at the upper portion thereof, installed with the guide shaft 46 and is, at the lower portion thereof, installed with the push plate guide 38 which is at its front portion installed with the roller 34.

The roller 34 serves to contact with the push plate guide 38 thereby to push the guide 38 up so that the guide shaft 46 installed at the upper portion of the push plate 22 is pushed up thereby to push the PCB up.

Figure 5:
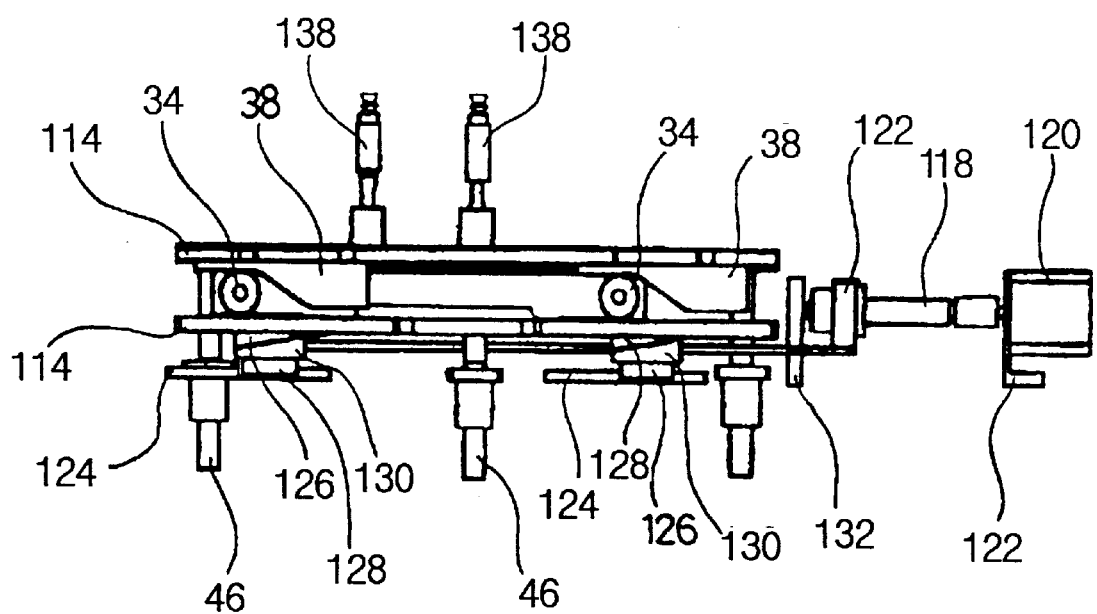
FIG. 5 is a front sectional view showing the compensating unit for compensating the flat level of the PCB according to the present invention.
Figure 6:
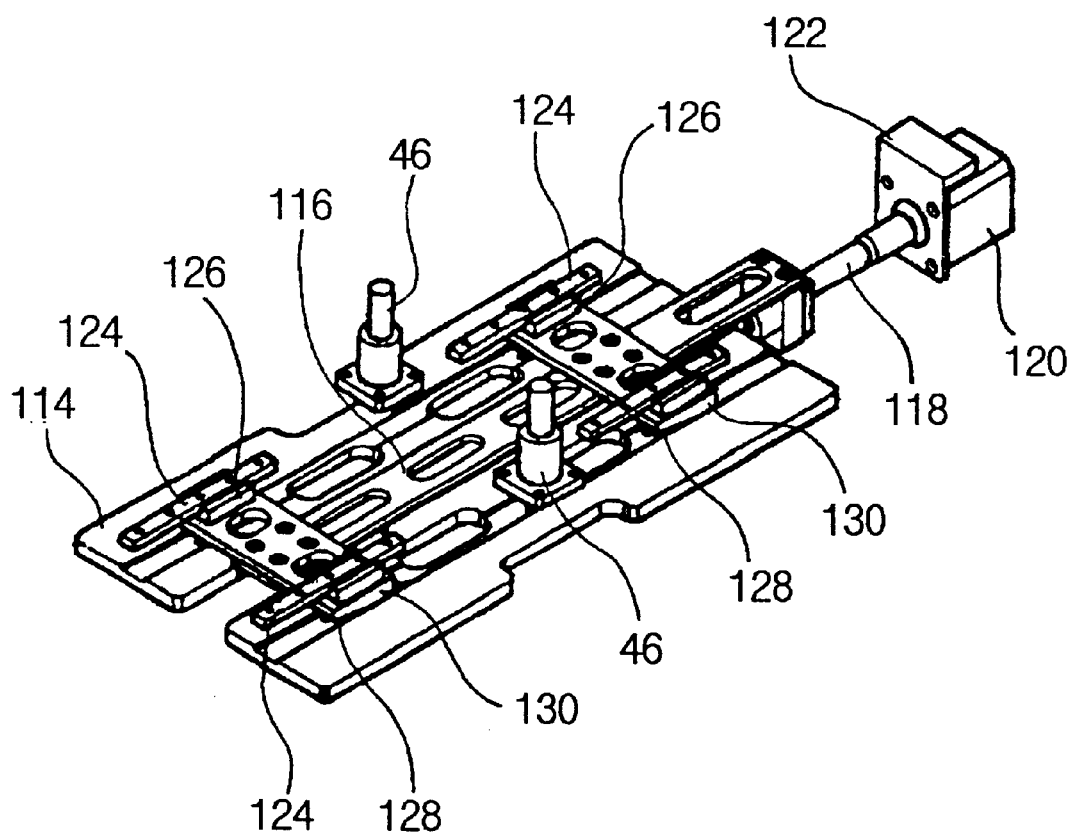
FIG. 6 is a perspective view showing the compensating unit for compensating the flat level of the PCB according to the present invention.

The push plate guide is, as shown in FIGS. 5 and 6, at the lower portion thereof, installed with the base 114 which is at its lower portion installed with the upper block 128.

The upper wedge-shaped block 128 is combined with the lower wedge-shaped block 130.

The moving plate 116 is securely installed to move in the forward and back ward direction with the lower wedge-shaped block 130. The moving plate 116 is, at its one end installed to the bracket 122 by the ball screw 118. The servo motor 120 is connected to the one end of the ball screw 118 to rotate the ball screw 118.

The lower wedge-shaped block 130 is, at the lower portion thereof, installed with the lateral motion block 126 to move in the forward and backward direction on the lateral motion rail 124. The base 114 is, at the lower portion thereof, installed with a plurality of guide shafts 46 to support the base 114. The base 114 is, at the upper portion thereof, installed with at least one compensating means 138 so that the distortion portion of the PCB is sucked and pushed the PCB thereby to compensate the flat level of the PCB.

FIG. 6 is a bottom perspective view of the flat level compensating unit according to the present invention.

The base 114 is, at the four edges of the lower portion thereof, installed with the upper wedge-shaped block 128 to contact with the lower wedge-shaped block 130. Because the lower wedge-shaped block 130 is secured to the moving plate 116 it can moves by rotating of the ball screw 118.

Meanwhile, the upper wedge-shaped block 128 and the lower wedge-shaped block 130 are contacted each other to have the grant portion so that the upper wedge-shaped block 128 is pushed up when the lower wedge-shaped block 130 is moved by the moving plate 116.

Figure 7:
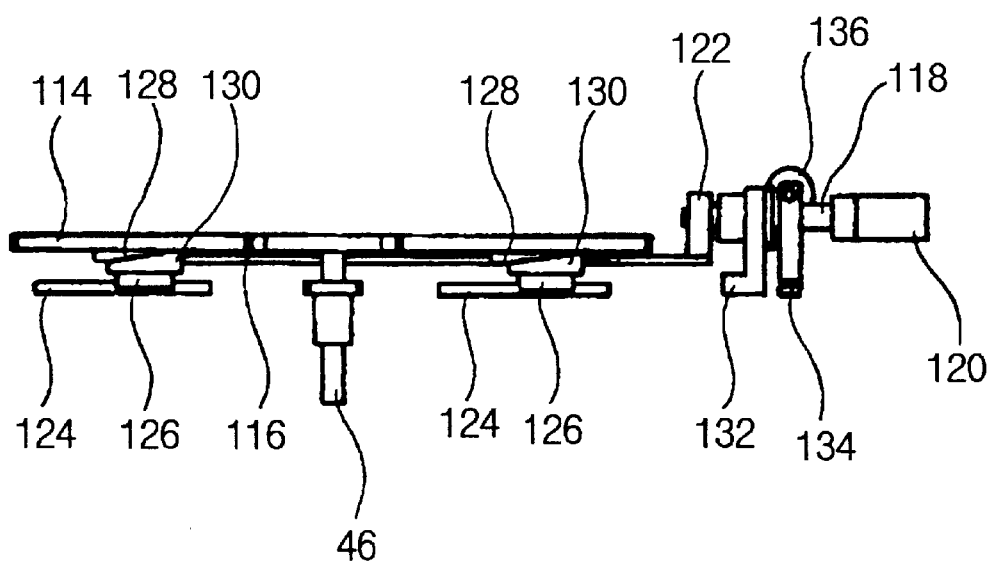
FIG. 7 is a sectional view for a state that the flat level compensating unit is coupled.
Figure 8:
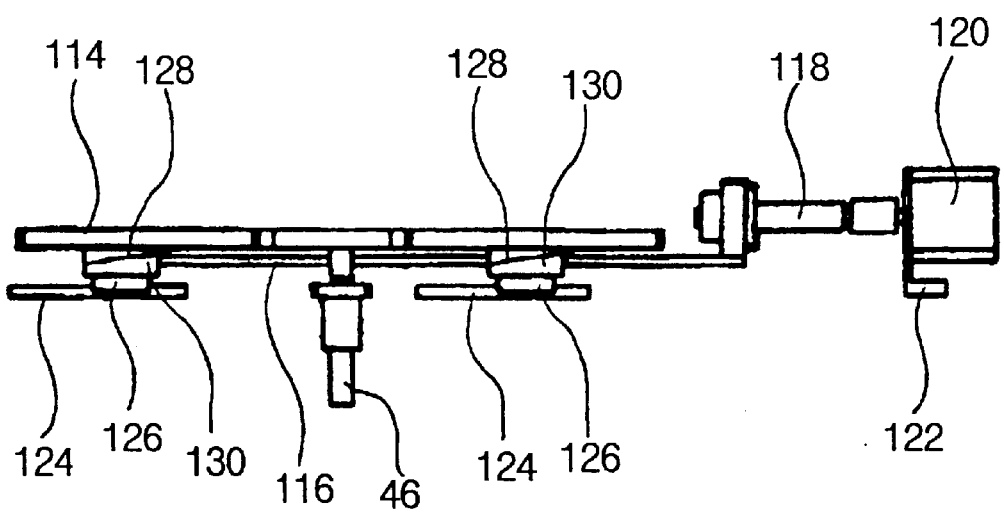
FIG. 8 is a sectional view for a state that the flat level compensating unit is operated.

Referring to FIGS. 7 and 8, the moving plate 116 is installed at the center portion of the base 114 and is, at its backward portion, secured to the bracket 122 which is at its one side secured with the ball screw 118. The ball screw 118 is supported by the ball screw support block 132 and is, at its one end, installed with the servo motor 120. Between the servo motor 120 and the support block 132 the coupling block is installed. The coupling block 134 is installed with the coupling handle 136.

Therefore, when the servo motor 120 drives, the ball screw 118 is rotated thereby to move the moving plate 116 in the forward direction.

When the plate 116 is moved and the lower wedge-shaped block 130 is moved in the forward direction, the upper wedge-shaped block 128 is pushed up facing on the grant portion with the lower wedge-shaped block 130. Accordingly, the base 114 is ascended. At this time, because the lower wedge-shaped block 130 is secured to the lateral motion block 126 the lower wedge-shaped block 130 is slidingly moved on the lateral motion rail thereby to control the rotation of the servo motor 120. Accordingly, the ascending height of the base 114 is minutely controlled thereby to be compensated the distortion of the PCB by compensating unit 138.

Figure 9:
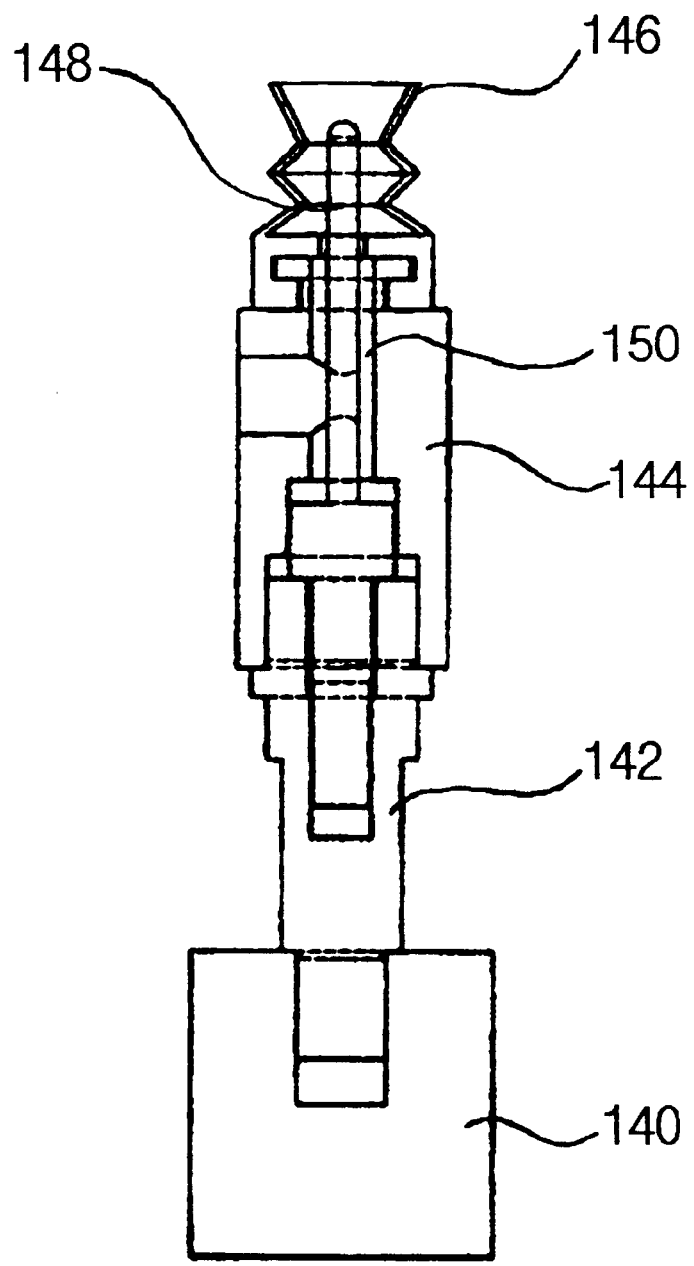
FIG. 9 is a front view for the compensating means for compensating the thickness of the PCB.

Referring to FIGS. 8 and 9, at least one compensating means 138 installed at the upper portion of the base 114 is constructed so that the magnetic piece 140 is secured to the upper portion of the base 114 and is, at its upper portion, secured to the supporting shaft 142.

The shaft 142 is, at its upper portion, continuously installed with the housing 144 and is installed with the bellows sucking plate 146 to compensate the distortion of the PCB.

At the center portions of the supporting shaft 142, the housing 144 and the sucking plate 146, the support pin 148 is installed to compensate the distortion by pushing the PCB in the upper direction.

The housing 144 is, at its center portion, formed with an air hole 150 to suck the PCB by the vacuum pressure. Accordingly, because the PCB is sucked by the sucking plate 146 and is pushed up by the pin 148, the flat level is decreased.

As the foregoing description when the base 114 is minutely pushed up to be control the height by the upper and lower wedge-shaped blocks 128 and 130, the bellows sucking plate of the compensating unit sucks the fed PCB to be pulled by a predetermined mount and the PCB is pushed up by the pin thereby to compensate the distortion of the PCB.

Furthermore, when the size of the device to be mounted is different, the height of that can be easily controlled thereby to prevent the device from being broken while the picker is contacted with the device. Furthermore, because this invention can apply to various devices it is very convenient to use without replacing the apparatus.

When the PCB is fed to be fixed at the working position, the mounter head 10 moved along the X-axis frame 109 of the gantry assembly 106 thereby to mount the device precisely.

As the foregoing description, the present invention provides a printed circuit board flat level compensating unit of a surface mounting apparatus in which when a PCB is stopped at its working position and is firstly pushed up from the lower portion thereof, the PCB is secondly pushed to be raised thereby to be compensated its flat level and the mounting height for the PCB according the thickness is adjusted thereby to be increased an amounting efficient and a precision Having described specific preferred embodiment of the invention with reference to the accompanying drawings, it is to be understood that various changes and modifications may be effected therein by one skilled in the art without departing from the scope or spirit of the invention as defined in the appended claims.

What is claimed is:

1. A printed circuit board mounting unit, comprising:
   a mounting plate;
   a plurality of upper positioning members attached to said mounting plate;
   at least one guide shaft configured to constrain a motion of said mounting plate;
   a positioning plate; and
   a plurality of lower positioning members attached to said positioning plate and configured to slidably engage said upper positioning members such that a motion of the positioning plate in a first direction will cause the mounting plate to move in a second direction.

2. The printed circuit board mounting unit of claim 1, wherein each said upper positioning member comprises a first inclined surface and each said lower positioning member comprises a second inclined surface, and said first inclined surface slidably engages said second inclined surface.

3. The printed circuit board mounting unit of claim 1, wherein said first direction is substantially perpendicular to said second direction.

4. The printed circuit board mounting unit of claim 1, further comprising a plurality of holders removably attached to said mounting plate.

5. The printed circuit board mounting unit of claim 4, wherein each holder is randomly re-positionable upon said mounting plate.

6. The printed circuit board mounting unit of claim 5, wherein each holder comprises a vacuum holder that includes:
   a support pin; and
   a vacuum bellows surrounding the support pin and configured to engage and hold a printed circuit board against the support pin.

7. The printed circuit board mounting unit of claim 5, wherein each holder comprises a magnetic base that is removably attachable to said mounting plate.

8. The printed circuit board mounting unit of claim 1, wherein each said lower positioning member is attached to a lateral motion block and said lateral motion block is slidably engaged with a lateral motion rail, and said lateral motion rail substantially limits motion of said lower positioning members to a single axis.

9. The printed circuit board mounting unit of claim 1, wherein said at least one guide shaft is attached to said mounting plate and slidably engages a bushing mounted on said positioning plate and substantially limits motion of said mounting plate to a single axis.

10. The printed circuit board mounting unit of claim 1, wherein said mounting plate further comprises:
   a push plate;
   at least one push plate guide comprising an inclined plane attached to said push plate; and
   at least one roller attached to said mounting plate and configured to roll against said inclined plane in a first direction and move said push plate in a second direction.

11. The printed circuit board mounting unit of claim 10, wherein said at least one roller comprises a cylindrical body with a groove formed along a circumference of an exterior of said cylindrical body.

12. The printed circuit board mounting unit of claim 11, wherein said groove is configured to engage said push plate guide such that said roller is constrained to roll upon said inclined plane.

13. The printed circuit board mounting unit of claim 1, wherein movement of the positioning plate in the first direction causes the mounting plate to move in the second direction to allow for printed circuit boards of different thicknesses.

14. A printed circuit board mounting unit, comprising:
   a mounting plate that is movable with respect to a circuit board conveyor; and
   a plurality of vacuum holders that are randomly re-positionable on the mounting plate, wherein each holder is configured to engage and hold a circuit board such that the circuit board is fixed with respect to the mounting plate.

15. The printed circuit board mounting unit of claim 14, wherein each said vacuum holder comprises a vacuum bellows configured to engage and hold a printed circuit board.

16. The printed circuit board mounting unit of claim 14, wherein each said vacuum holder comprises a support pin configured to fix a distance between a circuit board and said mounting plate.

17. The printed circuit board mounting unit of claim 14, wherein each said vacuum holder comprises a magnetic base removably attachable to said mounting plate.

18. A printed circuit board mounting unit, comprising:
   a mounting plate movable in a first direction and configured to grasp and position a printed circuit board fed by a conveyer; and
   an adjustment mechanism configured to adjust the position of the mounting plate in the first direction to allow the mounting plate to be used with printed circuit boards of differing thicknesses, wherein the adjustment mechanism includes:
   a positioning plate located beneath the mounting plate and having at least one inclined surface, wherein the positioning plate is moveable in a second direction, and
   at least one inclined surface mounted on a lower surface of the mounting plate and configured to interact with the inclined surface on the positioning plate such that movement of the positioning plate in the second direction causes the mounting plate to move in the first direction.

19. The printed circuit board mounting unit of claim 18, wherein the adjustment mechanism further includes a driver for moving the positioning plate in the second direction.

20. The printed circuit board mounting unit of claim 18, further comprising a movement mechanism configured to move the mounting plate in the first direction between a retracted position and an extended position.

* * * * *